United States Patent
Bartlett

[11] Patent Number: 5,880,515
[45] Date of Patent: Mar. 9, 1999

[54] CIRCUIT ISOLATION UTILIZING MEV IMPLANTATION

[75] Inventor: Donald M. Bartlett, Fort Collins, Colo.

[73] Assignee: LSI Logic Corporation, Milpitas, Calif.

[21] Appl. No.: 720,595

[22] Filed: Sep. 30, 1996

[51] Int. Cl.$^6$ .......................... H01L 29/00; H01L 23/544; H01L 23/29

[52] U.S. Cl. .......................... 257/547; 257/798; 257/797; 257/509

[58] Field of Search .................................. 257/797, 547, 257/798, 355, 509, 377, 373

[56] References Cited

U.S. PATENT DOCUMENTS

| | | | |
|---|---|---|---|
| 4,224,083 | 9/1980 | Cresswell | 148/1.5 |
| 5,043,292 | 8/1991 | Aronowitz et al. | 437/26 |
| 5,116,777 | 5/1992 | Chan et al. | 437/56 |
| 5,118,636 | 6/1992 | Hosaka | 437/35 |
| 5,268,312 | 12/1993 | Reuss et al. | 437/30 |
| 5,292,671 | 3/1994 | Odanaka | 437/29 |
| 5,317,183 | 5/1994 | Hoffman et al. | 257/369 |
| 5,453,713 | 9/1995 | Partovi et al. | 327/565 |
| 5,475,255 | 12/1995 | Joardar et al. | 257/547 |
| 5,501,993 | 3/1996 | Borland | 437/34 |

FOREIGN PATENT DOCUMENTS

| | | | |
|---|---|---|---|
| 3222467 | 10/1991 | Japan | H01L 27/04 |
| 5190777 | 7/1993 | Japan | H01L 27/06 |

*Primary Examiner*—Mahshid Saadat
*Assistant Examiner*—Jhihan B. Clark
*Attorney, Agent, or Firm*—David K. Lucente

[57] ABSTRACT

An integrated circuit includes a substrate and at least two circuits, such as a digital circuit and an analog circuit. The substrate is preferably derived from a bulk substrate wafer. The integrated circuit preferably comprises at least two islands in the substrate for noise isolation between the circuits. The two islands are buried-layers that are implanted, by preference, using conventional MeV techniques. A method of manufacturing an integrated circuit includes a substrate and at least two circuits. The method comprises the step of implanting at least two islands in the substrate for noise isolation between the circuits. The implanting is accomplished by conventional masking and high-energy implantation, such as MeV.

14 Claims, 2 Drawing Sheets

CIRCUIT ISOLATION UTILIZING MEV IMPLANTATION

FIELD OF THE INVENTION

The present invention relates to isolating circuits and more particularly to noise isolating between unrelated circuits on an integrated circuit.

BACKGROUND OF THE INVENTION

Noise isolation between unrelated circuits on an integrated circuit (IC) is highly desirable. This is particularly true when analog and digital circuits are on the same IC. Analog circuits are often processing minimal signals (<10 mV) and cannot tolerate interference generated by digital circuits on the same IC. FIG. 1 illustrates one of the mechanisms of coupling between separate functions on the same IC.

When digital circuitry 10 switches between high and low states, the change in the inputs and outputs of digital circuitry 10 create current impulses into the common substrate 15 via capacitor C2. Capacitor C2 represents multiple capacitors that are each associated with transistors within digital circuitry 10. The transistors are used to construct logic devices, such as inverters, NOR gates and AND gates. The current impulses flow through substrate 15 through resistors R1, R2 and R3 into ground connections 20, 25 of the IC.

The current flow through resistors R1, R2 and R3 causes voltage noise that is coupled to analog circuitry 30 through capacitor C1. This noise coupling mechanism causes noise within analog circuitry 30 which limits the minimal signal voltage that can be processed by analog circuitry 30 when provided on the same IC as digital circuitry 10.

The distribution of the current flow, and hence the amount of coupled noise, is dependent on the values of R1, R2 and R3. When RI is large and R3 is small relative to each other, the majority of current will flow through R2 and the noise is isolated from coupling to analog circuitry 30 by the effective voltage divider R3/(R1+R3). As R1 is decreased relative to R2 and R3, more noise voltage is coupled to analog circuitry 30. This typically occurs when substrate 15 is an epitaxial substrate that is used for IC processing.

Currently, two basic substrate architectures exist for standard CMOS processing: bulk substrate wafers and epitaxial layered wafers. Bulk substrate wafers consist of silicon that is uniformly doped to a constant carrier concentration. Epitaxial layered wafers have a base that is a heavily doped layer and a lightly doped epitaxial layer. The light doping of the epitaxial layer emulates the surface background carrier concentration similar to that of the bulk substrate wafers. The heavily doped layer provides a low impedance connection (R1), and thus more severe noise coupling, between analog circuitry 30 and digital circuitry 10.

Many alternatives exist to decrease the noise coupling through a common substrate. One alternative is to manufacture digital and analog circuits on separate ICs. This adds cost due to separate packaging and increased pin counts. Another alternative utilizes special processing steps, such as dielectric or junction isolation, that physically isolate unrelated circuits. However, these steps are costly compared to standard CMOS processes. Other alternatives rely on circuit design techniques, such as current-mode logic, or spacing of the unrelated circuits, but circuit noise isolation is still difficult to achieve using these alternatives.

SUMMARY OF THE INVENTION

The present invention includes an integrated circuit including a substrate and at least two circuits, such as a digital circuit and an analog circuit. The substrate is preferably derived from a bulk substrate wafer. The integrated circuit preferably comprises at least two islands in the substrate for noise isolation between the circuits. The two islands are buried-layers that are implanted, by preference, using conventional MeV techniques.

The present invention also includes a method of manufacturing an integrated circuit including a substrate and at least two circuits. The method comprises the step of implanting at least two islands in the substrate for noise isolation between the circuits. The implanting is accomplished by conventional masking and high-energy implantation, preferably MeV.

Numerous other advantages and features of the present invention will become readily apparent from the following detailed description of the invention and the embodiments thereof, from the claims and from the accompanying drawings in which details of the invention are fully and completely disclosed as a part of this specification.

DETAILED DESCRIPTION OF THE PREFERRED EMBODIMENTS

Figure 1:
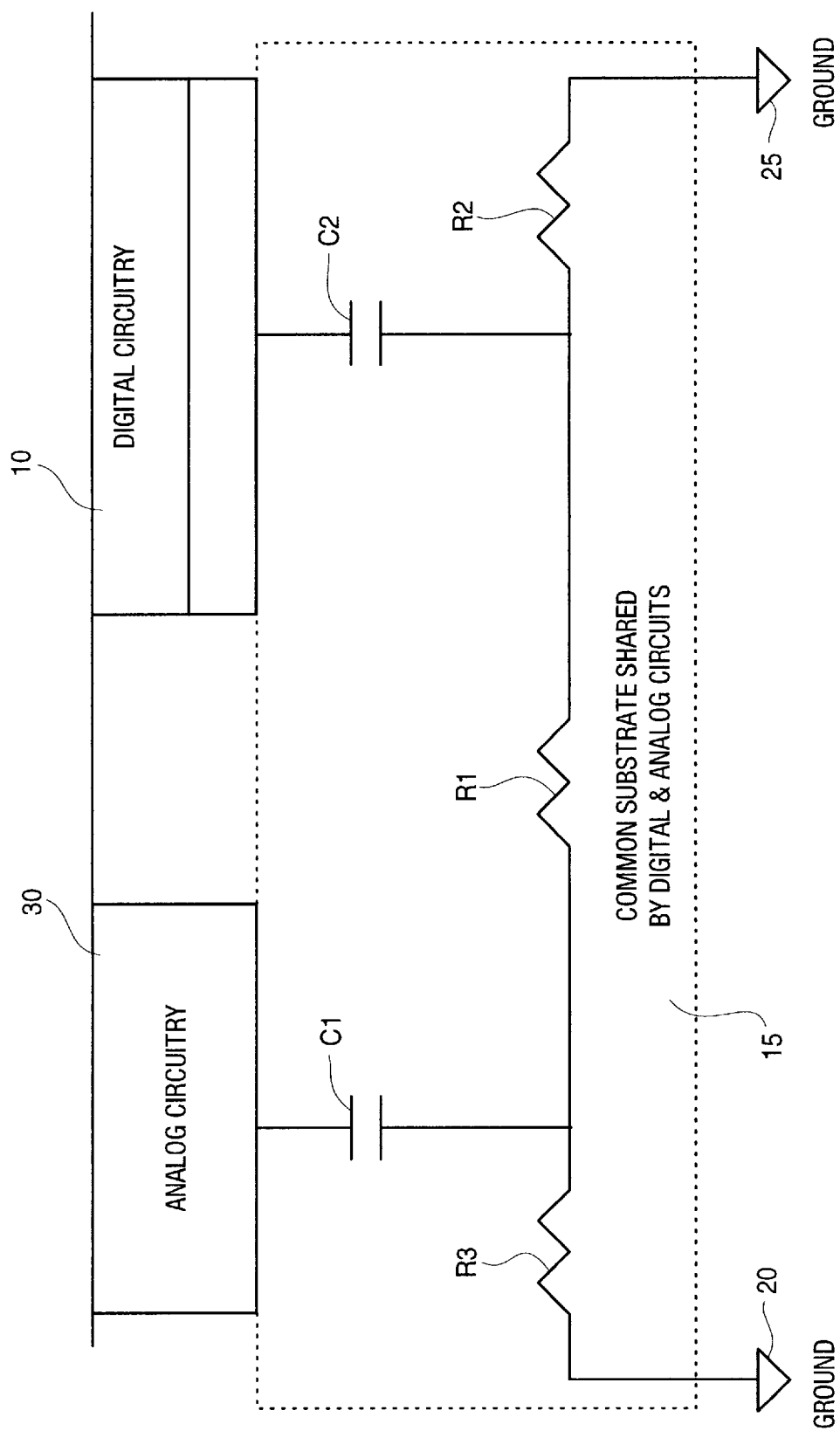
FIG. 1 is a cross-section of an integrated circuit having unrelated analog and digital circuitry that shows a noise coupling mechanism.

While this invention is susceptible of embodiment in many different forms, there is shown in the drawings and will be described herein in detail specific embodiments thereof with the understanding that the present disclosure is to be considered as an exemplification of the principles of the invention and is not to be limited to the specific embodiments described.

Figure 2:
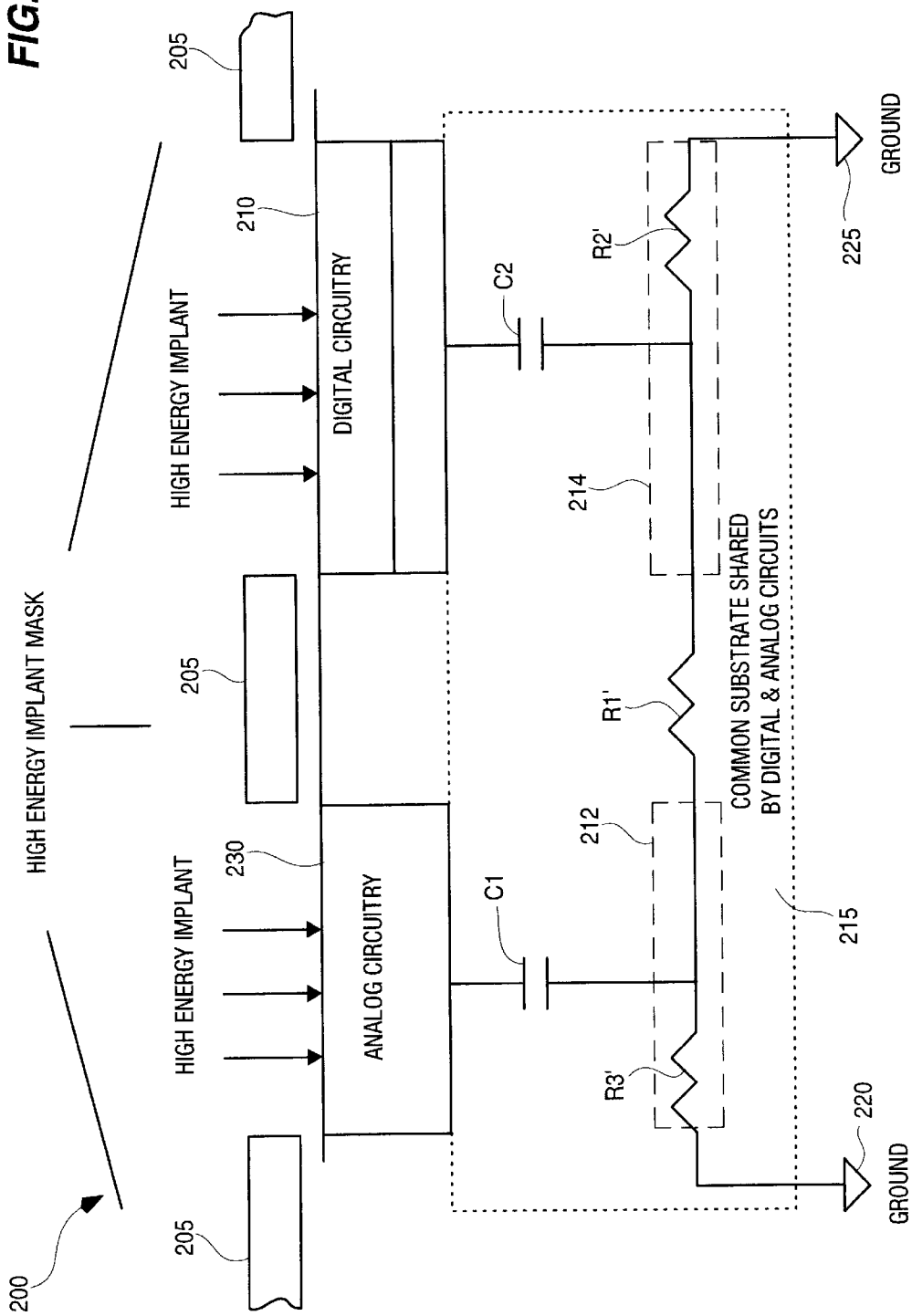
FIG. 2 is a cross-section of an integrated circuit having unrelated analog and digital circuitry that are isolated by implanted islands according to the present invention.

FIG. 2 illustrates an integrated circuit 200 according to the present invention. Substrate 215 is preferably part of a bulk substrate wafer with a high resistivity. In the earlier stages of the fabrication of integrated circuit 200, a high energy implant mask 205 is disposed on the surface of substrate 215. High energy implant mask 205 is a silicon dioxide film or a photo resist. Mask 205 should have sufficient thickness to stop penetration of the accelerated ions into substrate 215 when the ion implantation step is performed. Alternatively, a layer of a composition that stops ion penetration may be used in conjunction with the silicon dioxide film.

Next, a high energy implant, preferably of the order of million-electron-volt (MeV), is used to form islands 212 and 214. For example, a 5 µm deep boron implantation into a silicon substrate requires an acceleration energy of 3 MeV. The high energy implant has minimal effect on the values of the coupling capacitors C1 and C2. However, the implant significantly reduces the values of R2 and R3 to R2' and R3', all with respect to R1'. Specifically, the resistance of islands 212 and 214 are much less than the resistance of the substrate between these islands. Therefore, a high impedance isolation region is formed between islands 212 and 214 to effectively reduce the noise coupled between circuits 210 and 230.

One skilled in the art will readily recognize that tailoring the shape and size of the mask can lead to the optimization of the divider ratio to cause the noise coupling to be effectively eliminated. Adjusting the concentration of islands 212 and 214 will also optimize the elimination of the noise coupling. Furthermore, the present invention will lead to the reduction in both the size of system solutions as well as the cost of such systems.

I claim:

1. An integrated circuit, including a substrate and at least two circuits, comprising at least two buried layer islands in the substrate for noise isolation between the circuits.

2. The circuit of claim 1 wherein the islands have an impedance less than the impedance of the substrate.

3. The circuit of claim 1 wherein the islands are implanted using MeV implantation techniques.

4. The integrated circuit of claim 1 wherein only two islands are in the substrate.

5. The integrated circuit of claim 1 wherein one of the islands reduces a divider ratio.

6. The integrated circuit of claim 1 wherein a high impedance isolation region is formed between the islands to reduce noise coupled between the at least two circuits.

7. The circuit of claim 3 wherein the islands are implanted using masks.

8. An integrated circuit including a substrate, a digital circuit and an analog circuit, the substrate being derived from a bulk substrate wafer, comprising at least two islands in the substrate for noise isolation between the circuits, wherein the at least two islands are buried-layers and are disposed under the circuits.

9. The circuit of claim 8 wherein the islands are implanted by MeV techniques.

10. The integrated circuit of claim 8 wherein only two islands are in the substrate.

11. The integrated circuit of claim 8 wherein one of the islands reduces a divider ratio.

12. The integrated circuit of claim 8 wherein a high impedance isolation region is formed between the islands to reduce noise coupled between the at least two circuits.

13. A semiconductor device including a high impedance isolation region disposed between at least two buried islands for noise isolation, the at least two islands having reduced resistivity relative to the region.

14. The device of claim 13 wherein the region is disposed between only two buried islands.

* * * * *